(12) United States Patent
Mizuochi

(10) Patent No.: US 8,880,374 B2
(45) Date of Patent: Nov. 4, 2014

(54) CHARGED PARTICLE BEAM DEVICE

(75) Inventor: Masaki Mizuochi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 310 days.

(21) Appl. No.: 13/001,532

(22) PCT Filed: Jun. 18, 2009

(86) PCT No.: PCT/JP2009/061550
§ 371 (c)(1),
(2), (4) Date: Dec. 27, 2010

(87) PCT Pub. No.: WO2010/001790
PCT Pub. Date: Jan. 7, 2010

(65) Prior Publication Data
US 2011/0098960 A1    Apr. 28, 2011

(30) Foreign Application Priority Data

Jul. 2, 2008    (JP) .................................. 2008-172881

(51) Int. Cl.
*G06F 19/00* (2011.01)
*H01J 37/28* (2006.01)
*H01J 37/26* (2006.01)

(52) U.S. Cl.
CPC ......... *H01J 37/28* (2013.01); *H01J 2237/2826* (2013.01); *H01J 37/265* (2013.01); *H01J 2237/2817* (2013.01)
USPC .............................................. 702/95; 702/84

(58) Field of Classification Search
USPC ................ 702/84, 95; 235/462.24, 462.35
See application file for complete search history.

(56) References Cited

U.S. PATENT DOCUMENTS

| 4,334,241 | A | * | 6/1982 | Kashioka et al. ................ 348/87 |
| 5,329,130 | A | * | 7/1994 | Kai et al. .................. 250/492.22 |
| 5,994,864 | A | * | 11/1999 | Inoue et al. ................. 318/568.2 |
| 6,259,960 | B1 | | 7/2001 | Inokuchi |
| 2001/0050343 | A1 | * | 12/2001 | Kobaru et al. .............. 250/492.3 |
| 2004/0065848 | A1 | | 4/2004 | Onishi et al. |
| 2004/0217287 | A1 | * | 11/2004 | Watanabe et al. ............. 250/310 |
| 2006/0102839 | A1 | * | 5/2006 | Bhaskar et al. ................ 250/310 |
| 2006/0169895 | A1 | * | 8/2006 | Honda et al. ................... 250/310 |
| 2007/0069158 | A1 | | 3/2007 | Ohnishi |
| 2008/0078947 | A1 | * | 4/2008 | Horiuchi et al. ........... 250/492.2 |
| 2009/0039260 | A1 | | 2/2009 | Ohnishi |

FOREIGN PATENT DOCUMENTS

| JP | 6-151564 | 5/1994 |
| JP | 10-135288 | 5/1998 |
| JP | 2000-260683 | 9/2000 |
| JP | 2004-128196 | 4/2004 |
| JP | 2007-093458 | 4/2007 |

* cited by examiner

*Primary Examiner* — Sujoy Kundu
*Assistant Examiner* — Ivan Rabovianski
(74) *Attorney, Agent, or Firm* — McDermott Will & Emery LLP

(57) ABSTRACT

Provided is a charged particle beam device wherein a secondary signal generated from an alignment pattern having known coordinate values in a sample coordinate system is detected, and a positional deviation quantity between the coordinate system of a sample (10) and the coordinate system of a stage (21) is calculated so as to generate coordinate correction data. At the time of observing a sample image, the secondary signal generated from the alignment pattern is detected at least once so as to perform realignment, and the coordinate correction data is updated. Thus, the charged particle beam device performs long-time inspection at a high observation magnification by accurately correcting the sample coordinate information obtained by temperature change, while suppressing device cost increase and throughput deterioration.

4 Claims, 6 Drawing Sheets

CHARGED PARTICLE BEAM DEVICE

RELATED APPLICATIONS

This application is the U.S. National Phase under 35 U.S.C. §371 of International Application No. PCT/JP2009/061550, filed on Jun. 18, 2009, which in turn claims the benefit of Japanese Application No. 2008-172881, filed on Jul. 2, 2008, the disclosures of which Applications are incorporated by reference herein.

TECHNICAL FIELD

The present invention relates to a charged particle beam device such as an electron microscope, a semiconductor wafer inspection device and an ion beam observation device.

BACKGROUND ART

In recent years, the integration degree of semiconductor devices is increasingly improved and the still more minute circuit pattern is requested. Various inspection measures are used for a sample in which circuit pattern is formed as represented by semiconductor wafer for the purpose of quality control and improvement of yield. For example, a scanning electron microscope is known in which a sample is irradiated with a charged particle beam to measure the accuracy of dimensions of circuit pattern or produce an image of the sample from a secondary signal obtained from the sample, so that defect of the circuit pattern or foreign substance attached to the circuit pattern is estimated.

As a line width rule of circuit pattern, the observation magnification having three hundred thousand or more magnifications is sometimes applied in order to conform to the design rule of 35 nm node, for example. The observation view range at this time is equal to or smaller than 0.5 µm on a side. Accordingly, in order to display circuit pattern or defect to be observed in the vicinity of the center of display, it is necessary to recognize sample coordinates with accuracy of one quarter or less of the observation range, for example 0.1 µm. The fixed point observation is sometimes required for specific pattern in all chips formed in wafer for the reason that manufacturing defect is apt to occur or dimensions are required to be managed.

At present, the wafer size is 300 mm in diameter in the mainstream and accordingly a stage of a device on which a wafer is put becomes considerably large. At the same time, a high-output drive mechanism for high-speed operation of stage is required from the viewpoint of improvement of throughput. However, there arises a problem that temperature is increased due to generation of heat in motor and driving shaft of the high-output drive mechanism and the generated heat causes change in temperature of sample or periphery of sample through parts, so that the coordinates of place irradiated with charged particle beam are shifted or deviated from target. Furthermore, when there is temperature difference between wafer and stage, sample is expanded or contracted with time, so that the above problem is caused. Moreover, the irradiated charged particle beam itself is converted into thermal energy to some degree, so that temperature change occurs. For these phenomena, if the observation range is made larger in order to set the coordinates to be observed within the observation range, the coordinates are easily set within the observation range, although there also arises a problem that it is difficult to find small observation object and throughput is reduced. In addition, when the diameter of wafer is increased to 450 mm, it is expected that deviation of coordinates of sample due to temperature change causes large problem.

Heretofore, as a method of reducing thermal expansion of sample or periphery of sample due to the thermal expansion and contraction, there is known a method of measuring temperature of sample and controlling so that the temperature is kept to be fixed by means of heat source such as heater (refer to patent document 1, for example).

Furthermore, there is also known a method of obtaining behavior of sample by temperature change based on energy of charged particle beam with which sample is irradiated in advance by simulation or experiment and correcting deviation of coordinates (refer to patent document 2, for example).

CITATION LIST

Patent Literature

Patent Literature 1: JP-2000-A-260683
Patent Literature 2: JP-2004-A-128196

SUMMARY OF INVENTION

Technical Problem

The configuration described in the above patent document 1 requires a high-accurate temperature sensor for measuring temperature of sample such as wafer or periphery thereof to control the temperature to be fixed, a heat source such as heater and a control part for controlling them, so that increased device cost is unavoidable. Further, when sample or parts to be controlled has a large thermal capacity, the time constant of temperature is increased and it takes a long time to control the temperature to be fixed. Moreover, when a plurality of heat sources cannot be provided, local temperature control is impossible and accordingly there is a possibility that the sample is thermally expanded unevenly after all and coordinates of the sample are distorted.

On the other hand, the method of predicting coordinates of sample deviated due to temperature change is difficult to make prediction with high accuracy since conditions change when device is changed and there is a problem that it takes time to previously prepare reference data for each device.

It is an object of the present invention to provide a charged particle beam device which can correct deviation of sample coordinates due to temperature change or vibration with high accuracy while suppressing increase of device cost and reduction of throughput and can perform inspection for a long time with high observation magnifications.

Solution to Problem

In order to solve the above problems, according to an embodiment of the present invention, the charged particle beam device which detects a secondary signal generated by irradiating a sample put on a stage with a charged particle beam and displays an image of the sample on a display unit, comprises a control part which calculates a positional deviation quantity between a coordinate system of the sample and a coordinate system of the stage on the basis of secondary signal generated from an alignment pattern on the sample having known coordinate values in the coordinate system of the sample to produce coordinate correction data and detects the secondary signal generated from the alignment pattern at least once to perform realignment to update the coordinate correction data.

Advantageous Effects of Invention

According to the present invention, there can be provided the charged particle beam device which can reduce deviation of coordinates of the sample due to temperature change and can perform inspection for a long time with high observation magnification while suppressing increase of device cost and reduction of throughput.

DESCRIPTION OF EMBODIMENTS

A first embodiment in which a scanning electron microscope is taken as an example for a charged particle beam device to which the present invention is applied is described with reference to FIGS. 1 to 5.

Figure 1:
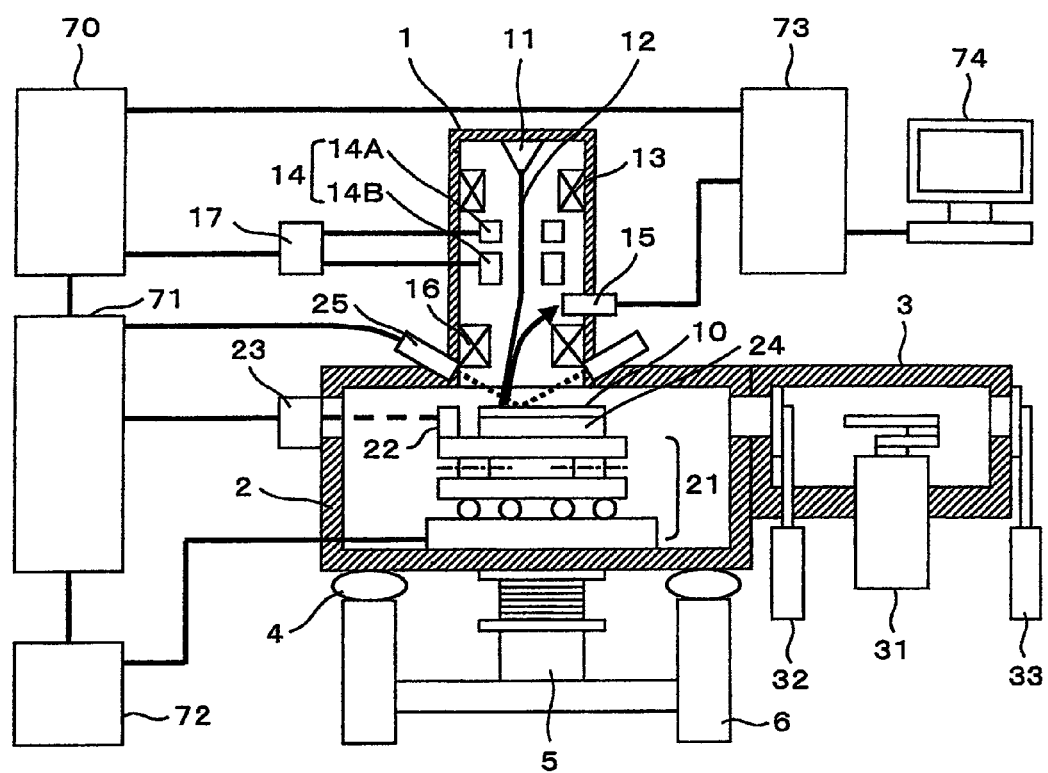
FIG. 1 is a longitudinal sectional view schematically illustrating a scanning electron microscope.

FIG. 1 is a longitudinal sectional view schematically illustrating the scanning electron microscope. The scanning electron microscope primarily includes a column 1 in which an electronic optical system composed of electron lens group generates an electron beam 12 to irradiate a sample 10 with the electron beam 12 and vacuum is maintained within the column, a stage 21 which can be moved in the two-dimensional direction so as to irradiate desired position of the sample 10 with the electron beam 12 and a sample chamber 2 for maintaining a vacuum around the stage 21 on which the sample 10 is put. The sample chamber 2 is installed on a floor of a clean room or the like by frame 6 through mounts 4 for suppressing vibration of the floor. The sample chamber 2 is evacuated by a vacuum pump 5 and the inside of the column 1 is also maintained to the high vacuum degree by a vacuum pump not shown.

A load lock 3 in which a conveyance robot 31 for conveying the sample 10 is installed is attached in the sample chamber 2. A vacuum-side gate valve 32 for separating from the sample chamber 2 and an atmosphere-side gate valve 33 for separating from atmosphere are attached to the load lock 3. When the sample 10 is conveyed to the sample chamber 2, the atmosphere-side gate valve 33 is opened and the conveyance robot 31 conveys the sample 10 from the atmosphere side into the load lock 3. Then, the atmosphere-side gate valve 33 is closed and air in the load lock 3 is evacuated by a vacuum pump not shown. When the vacuum degree in the load lock 3 is nearly equal to that in the sample chamber 2, the vacuum-side gate valve 32 is opened and the conveyance robot 31 conveys the sample 10 onto the stage 21 provided in the sample chamber 2. The sample 10 is electrostatically absorbed by an electrostatic chuck 24 attached to the stage 21 to be held. Arms of the conveyance robot 31 can be extended into the sample chamber 2, so that the sample 10 can be put on the stage 21. When the sample 10 is conveyed outside of the device, the opposite operation to the above operation is performed.

A rod-shaped bar mirror 22 is mounted to the stage 21 and relative distance change between the bar mirror 22 and an interferometer 23 attached to the sample chamber 2 can be measured by laser, so that position of the sample on the stage 21 can be managed. Data measured by the interferometer 23 is sent to a position control part 71, so that position information of the stage 21 is produced to be sent to a stage control part 72 for driving the stage 21. The stage control part 72 performs feedback control so that difference between current position and target position for photographing disappears. The feedback control can use control performed by only simple position feedback and PID control in which velocity information of the stage and integration information of positional deviation of the stage are added to improve response speed and positioning accuracy.

Target position of the sample 10 is irradiated with electron beam 12 generated by an electron gun 11 in the column 1 and secondary electrons and reflected electrons generated from the sample 10 are detected to be imaged for the purpose of observation of the sample 10 and extraction and inspection of defect and foreign substance attached to the sample. The electron beam 12 is narrowed by electron lenses 13 and 16 having convergence function and focused on the sample 10 to be irradiated with the electron beam. In order to produce an image of the sample 10 by the narrowed electron beam 12, the electron beam 12 scans the surface of the sample 10 by means of a scanning deflector 14B of deflectors 14 to irradiate the surface of the sample with the electron beam. Secondary signal such as secondary electrons and reflected electrons is generated from the sample 10 by irradiation of the electron beam 12 and detected by a detector 15.

The scanning deflector 14B is controlled by a deflection control part 17. The deflection control part 17 and the electron lenses 13 and 16 are controlled by a column control part 70. Data of the secondary signal detected by the detector 15 and control information of the scanning deflector 14B are transmitted to an image control part 73. The image control part 73 produces an image on the basis of the control information of the deflector and information from the detector and displays the image in a display 74.

A Z sensor 25 for detecting height of the sample 10 is mounted above the sample chamber 2 to monitor the height of the sample 10. Signal obtained by the Z sensor 25 is converted into position data by the position control part 71 and then sent to the column control part 70. The column control part 70 changes electronic optical conditions of the electron lenses 13 and 16 and performs processing so that focus of the electron beam 12 is not deviated even if the height of the sample 10 is changed.

Position information of the stage measured by the interferometer 23 is sent to the column control part 70 for controlling the column 1 to correct deflection control signal of the electron beam 12. The deflectors 14 are divided into a position deflector 14A for positioning the deflection center of the electron beam to the sample position and the scanning deflector 14B for scanning target view with the charged particle beam at high speed for photographing and these deflectors are controlled by the deflection control part 17. For example, when the current position of the stage is shifted or deviated from the target coordinates within the deflection range, deviation thereof is transmitted from the position control part 71 to the column control part 70 and deviation value is added to deflection command value in the state that there is no deviation as correction value.

Figure 2:
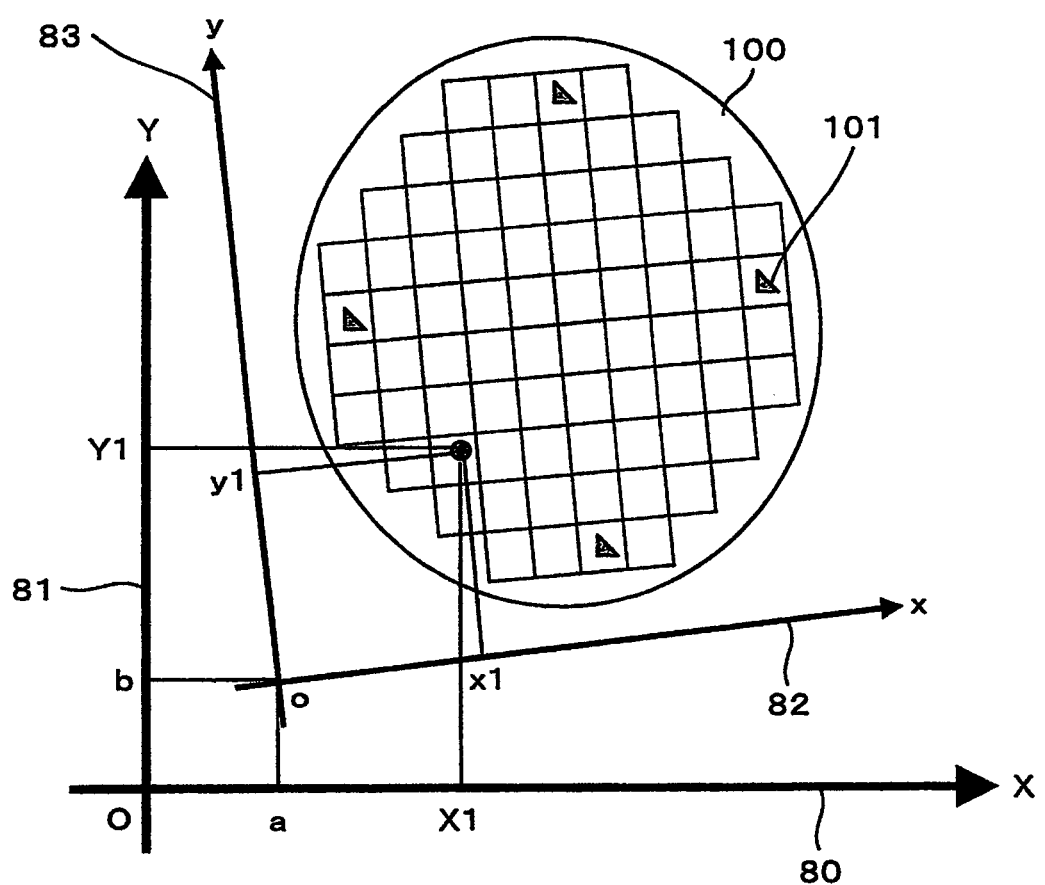
FIG. 2 is a schematic diagram showing the relation of a wafer coordinate system and a stage coordinate system.

FIG. 2 is a schematic diagram showing the relation between a wafer coordinate system and a stage coordinate system. The stage coordinate system is a coordinate system peculiar to the device and in an example of FIG. 2 a coordinate axis X 80 and a coordinate axis Y 81 of the stage coordinate system have the origin O of the stage as the reference. The stage coordinate system is always fixed irrespective of position and shape of wafer. On the other hand, the wafer coordinate system is decided by position of pattern formed. A coordinate axis x 82 and a coordinate axis y 83 of the wafer coordinate system have the origin o of the stage as the reference. The wafer coordinate system is different for each wafer and is decided by accuracy of pattern formed. Further, the relation of the wafer coordinate system and the stage coordinate system is different depending on mounting accuracy of wafer on the stage. When coordinate values of the wafer coordinate system of one point on a wafer 100 are defined to (x1, y1), the positional relation between both origins and the angular relation between both coordinate axes can be expressed by the following:

$$X1 = m(\cos\beta + \sin\beta \tan\alpha) \cdot x1 - (n \sin\beta/\cos\alpha)y1 + a$$

$$Y1 = m(\sin\beta + \cos\beta \tan\alpha) \cdot x1 + (n \cos\beta/\cos\alpha)y1 + b$$

Where

X1, Y1: coordinate values of stage coordinate system x1, y1: coordinate values of wafer coordinate system a, b: shift amount of both origins of stage coordinate system and wafer coordinate system (in X and Y directions)

m: scale correction value in x direction of wafer coordinate system n: scale correction value in y direction of wafer coordinate system α: orthogonal error of wafer coordinate system β: angular error of wafer coordinate system and stage coordinate system As described above, since the relation between two coordinate systems is changed each time wafer is mounted and the wafer coordinate system itself is different for each wafer, it is necessary to perform alignment operation before an image of wafer is taken in inspection of wafer. The alignment operation is performed using a plurality of alignment patterns 101 formed on wafer 100.

Figure 3:
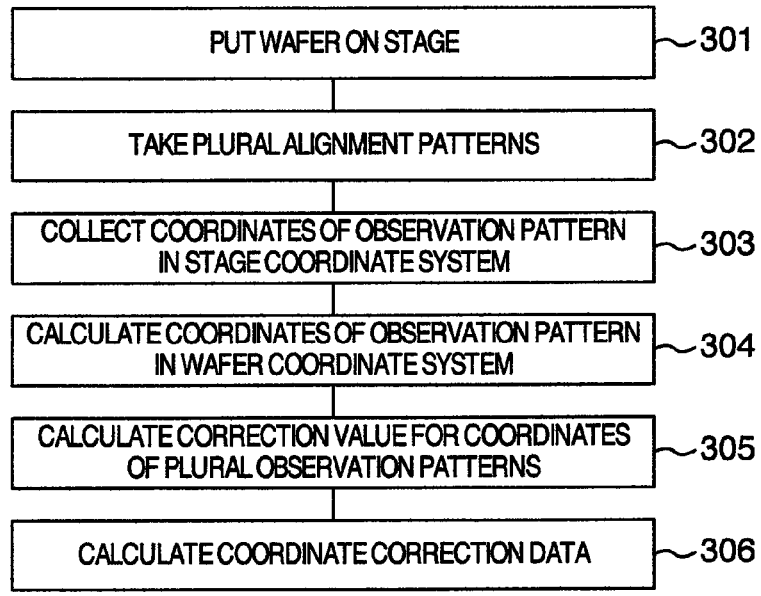
FIG. 3 is a flow chart showing alignment procedure of the scanning electron microscope.

FIG. 3 is a flow chart showing conventional alignment procedure of scanning electron microscope. First, a wafer that is the sample 10 is put on the stage (step 301) and a plurality of alignment patterns of wafer are taken with a wide range of view having low magnification (step 302). The alignment pattern has shape and coordinates in the wafer coordinate system which have been registered in advance. Image taken of observation pattern in target position is used to collect coordinates of the observation pattern in the stage coordinate system (step 303). Coordinates in the wafer coordinate system to the stage coordinate system are calculated on the basis of information obtained (step 304). The calculated coordinates are expressed by origin offset that is distance between both origins and rotation angle of coordinate axes.

Mutual distance for coordinates of the plurality of observation patterns observed is calculated and compared with design value, so that expansion and contraction state of wafer to the stage coordinate system is calculated as correction value (step 305). This value is named scale correction value since distance in the stage coordinate system is not absolutely correct for the reason of accuracy of a length measuring device and is only relative scale value. Coordinate correction data for converting the wafer coordinate system into the stage coordinate system is calculated on the basis of position in the wafer coordinate system to the stage coordinate system and the scale correction value (step 306). Even if the coordinate correction data for converting the stage coordinate system into the wafer coordinate system is calculated, the meaning is similar.

By the above procedure, coordinates to be observed in the wafer coordinate system to the stage coordinate system are converted into the stage coordinate system, so that desired inspection can be performed. Usually, at least two or more alignment patterns are required in order to convert the wafer coordinate system into the stage coordinate system with high accuracy. In the embodiment, as shown in FIG. 2, four alignment patterns 101 are arranged on all sides so as to be able to measure angular difference of X coordinates axis and Y coordinate axis of the wafer coordinate system and scale correction value.

Figure 4:
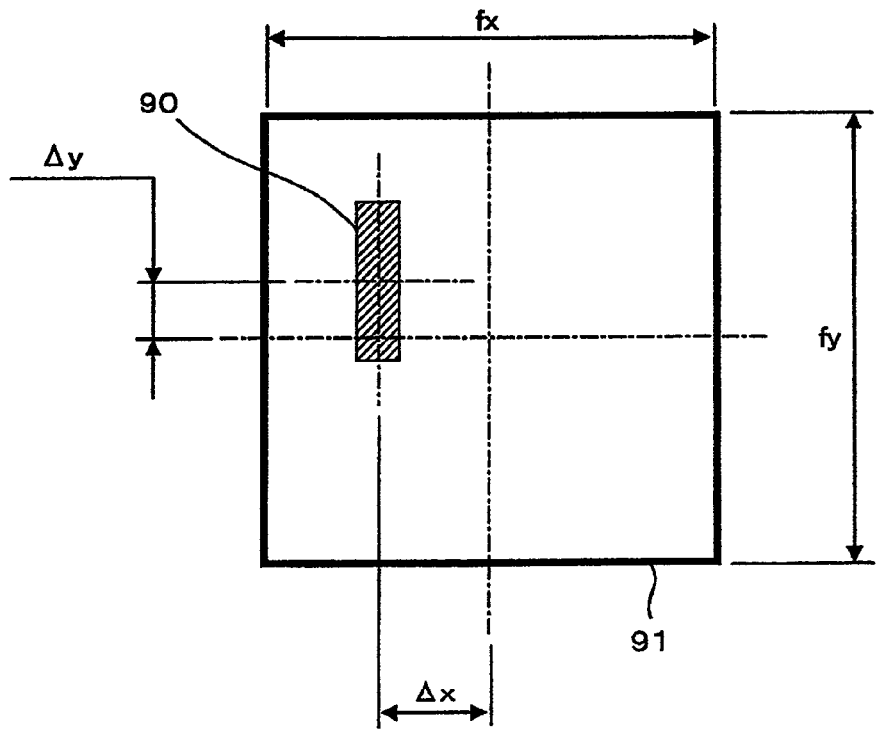
FIG. 4 is a diagram showing an image taken of an observation object 90 in an observation range 91.

FIG. 4 is a diagram showing an image taken of an observation object 90 in an observation range 91. When temperature change occurs in wafer or periphery of wafer during inspection, the wafer is expanded or contracted and the relation of length measurement reference of stage and position of wafer is changed. In an example shown in FIG. 4, positional deviation of Δx in x direction and Δy in y direction occurs. Thus, pattern or defect to be observed is shifted or deviated to position distant from the center of the observation range and when temperature change is extremely large, the pattern or defect is shifted or deviated outside of the observation range.

Figure 5:
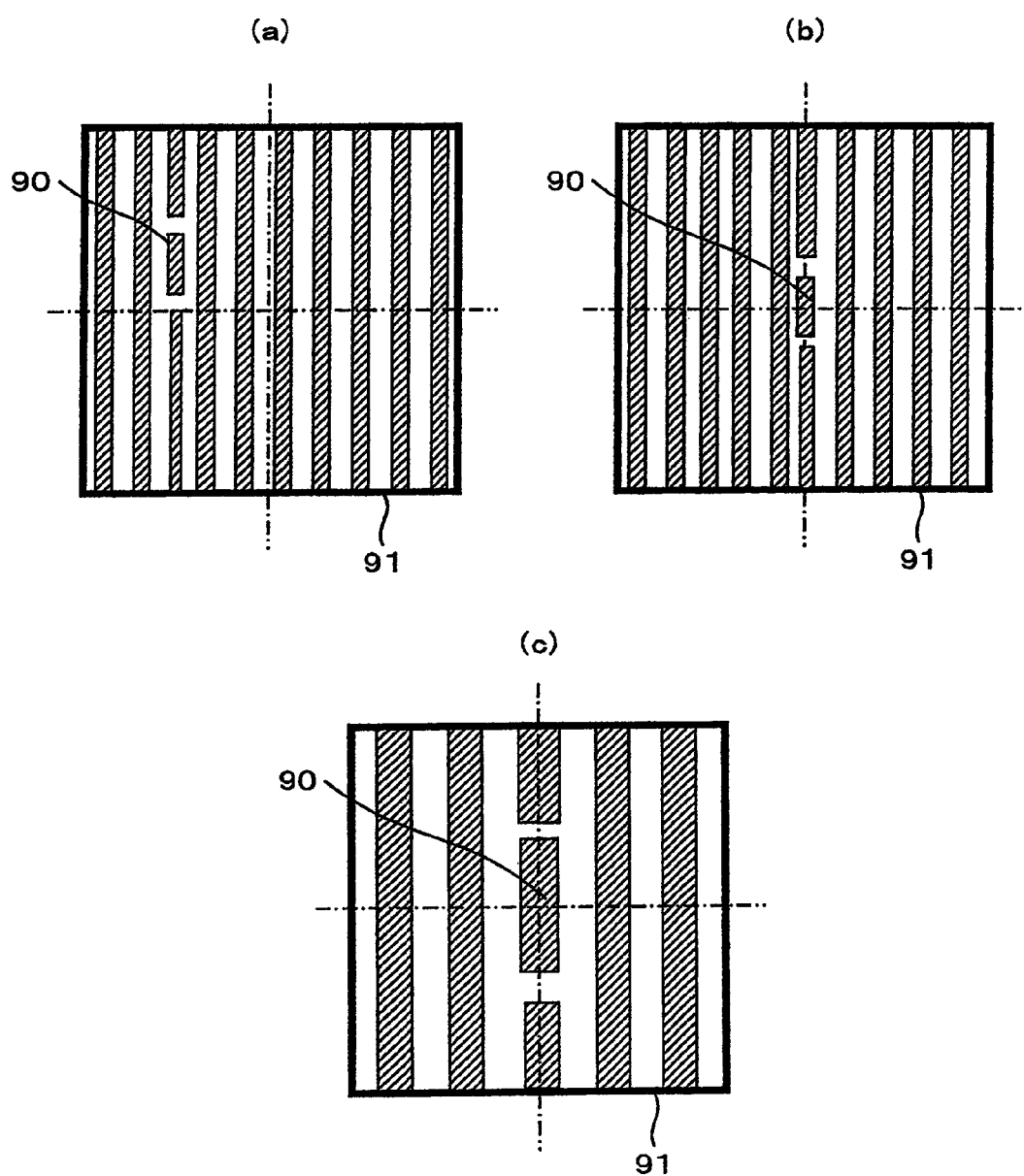
FIG. 5 is a diagram showing images taken of the observation objects 90 in the observation ranges 91.

FIG. 5 is a diagram showing images taken of the observation objects 90 in the observation ranges 91 similarly to FIG. 4. Heretofore, as shown in the (a) of FIG. 5, coordinates of the observation object 90 sent from inspection device is set in the center of the observation view and the observation object is taken with low magnification. The observation object is compared with reference image and reference pattern shown in the (b) of FIG. 5 to calculate positional deviation of the observation object 90. The positional deviation is used as correction value to set the observation object 90 in the center of the observation view and the observation object is taken with high magnification as shown in the (c) of FIG. 5. This procedure requires time for preparation of reference image of low magnification, taking or photographing of observation object 90 with low magnification, comparison with reference image, calculation of positional deviation and change of electron lens condition from low magnification to high magnification and waiting of matching.

In contrast, in the embodiment of the present invention, photographing with low magnification is not performed and alignment operation is performed to correct positional deviation, so that photographing with high magnification is performed. Further, positional deviation is corrected by pattern matching with reference image and reference pattern of high magnification or design data to perform realignment and the above operation is performed repeatedly. Thus, observation with high magnification can be made without reducing correction accuracy of positional deviation due to temperature change at periphery of wafer and time for the photographing with low magnification is not required entirely, so that throughput can be improved greatly.

As the realignment operation, there is considered a method of performing alignment operation when observation with high magnification is started and certain fixed time elapses. Coordinate correction data is updated by realignment and when observation is performed again, positional deviation of coordinates is reset and sample can be observed with improved coordinate accuracy. With regard to the update period, a method of updating coordinate correction data at intervals of fixed observation time, for example, at intervals of 10 minutes, a method of updating coordinate correction data at intervals of fixed number of times of observation, for example, at intervals of hundred times of observation, a method of updating coordinate correction data at intervals of previously set area of wafer and a method of updating coordinate correction data at intervals of previously set stage movement distance are considered.

Figure 6:
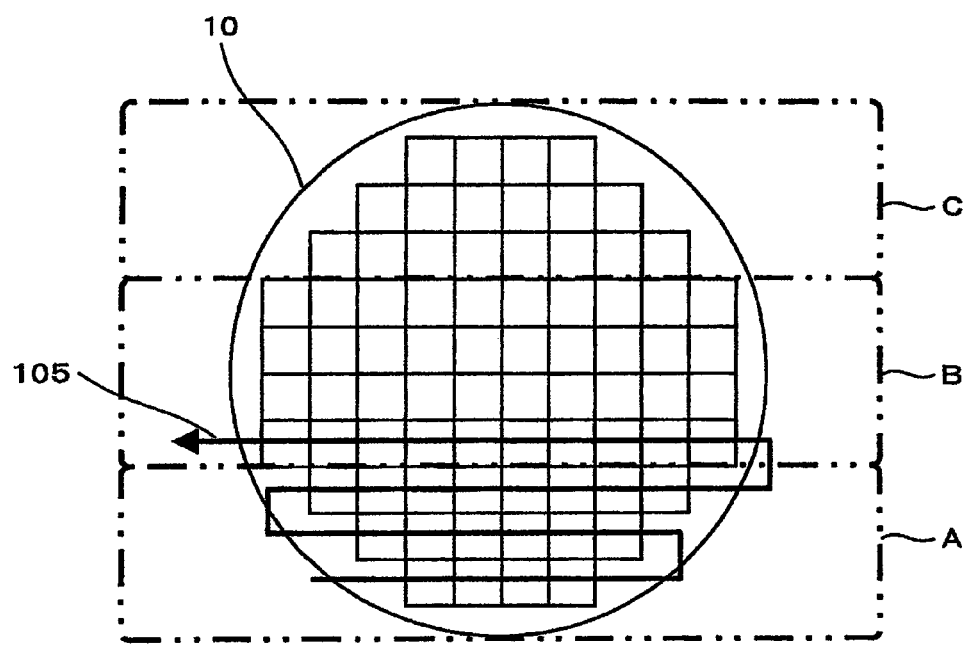
FIG. 6 is a plan view of a wafer.

FIG. 6 is a plan view of a wafer and in FIG. 6 the observation order to die is represented by arrow. As timing of realignment, there is also considered a method of dividing the wafer into a plurality of areas and performing realignment each time observation for each area is completed instead of time. For example, as shown in FIG. 6, there is a method in which the wafer that is the sample 10 is divided into a plurality of areas A, B and C and alignment is performed when observation of area A is completed and observation is moved to next area B and when observation is moved from area B to area C. Arrow 105 in FIG. 6 represents observation order.

Figure 7:
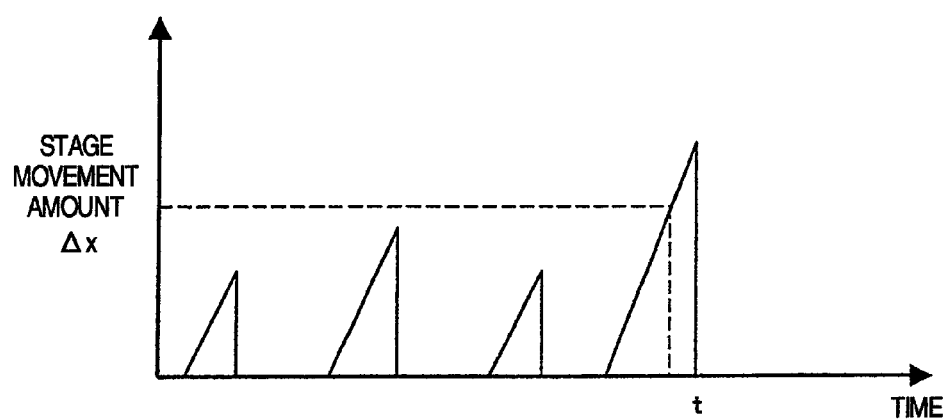
FIG. 7 is a time chart showing movement amount of a stage versus time.

FIG. 7 is a time chart showing a movement amount of stage versus time. When an amount of heat generated from driving part of the stage is large, a method of performing alignment after stage movement is ended at intervals of fixed distance is suitable. The stage movement amount from the beginning of observation is monitored and alignment operation is performed at time t that the stage movement amount exceeds a threshold $\Delta x$. The threshold $\Delta x$ of the stage movement amount can be inputted in a picture by user and be set to any value.

When the scanning electron microscope has the function of pattern matching for calculating positional deviation of design data and observation pattern, the function may be used to correct positional deviation for each observation and perform realignment. This method has the merit that the deviation quantity is monitored by pattern matching for each observation and accordingly alignment operation can be performed exactly.

Furthermore, there is also considered a method that the positional deviation quantity exceeds a previously set threshold, realignment is performed and coordinate correction data is updated. The threshold of the positional deviation quantity may be set voluntarily, although as shown in FIG. 4 it may be set automatically in accordance with the observation range represented by fx and fy in FIG. 4 or observation magnification. For example, alignment is set to be performed when the deviation quantity of a quarter of the observation range is generated.

The image taken immediately after alignment has relatively good coordinate accuracy, although when observation is advanced and time elapses, coordinate deviation occurs gradually due to temperature change described above. Image is taken while pattern matching using high-magnification image is performed, so that deviation quantity in each of coordinates can be grasped and correction can be performed. Observation is repeated while the deviation quantity is added to correction data of coordinates to update correction data successively.

Figure 8:
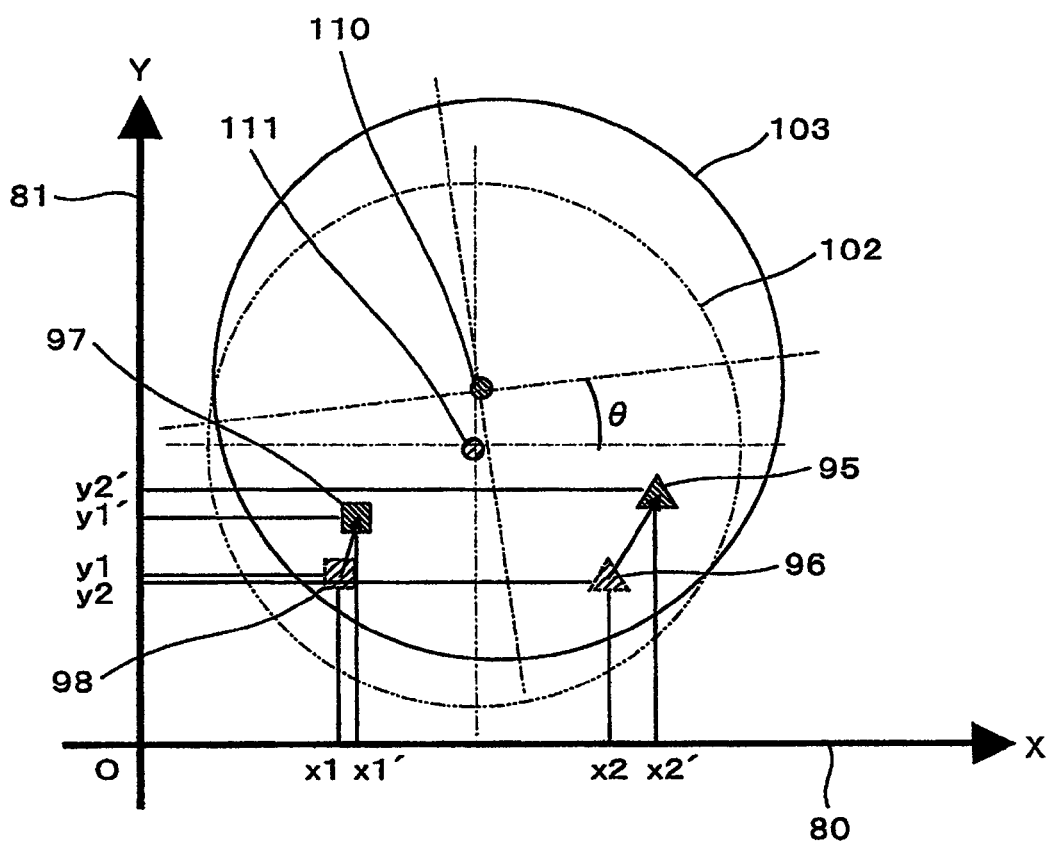
FIG. 8 is a schematic diagram showing the relation of observation object on wafer and stage coordinate system.

FIG. 8 is a schematic diagram showing the relation of observation object on wafer and stage coordinate system. In FIG. 8, there are shown a conceptual shape 103 in the wafer coordinate system of reference pattern and a conceptual shape 102 in the wafer coordinate system of observation pattern as wafer shapes. Shown in FIG. 8 are area 102 indicating the wafer coordinate system of reference pattern produced from design data such as CAD data and area 103 indicating the wafer coordinate system of observation pattern taken practically in regard to stage coordinate axis X 80 and stage coordinate axis Y 81. Since reference patterns 96 and 98 are produced from design data such as CAD data, it is not necessary to take image and the reference patterns 98 and 96 have known coordinates (x1, y1) and (x2, y2), respectively. On the other hand, coordinates of observation patterns 97 and 95 obtained by taking practically are represented by (x1', y1') and (x2', y2'), respectively. Further, past wafer center 111 is changed to current wafer center 110.

Past and current change amounts of the wafer coordinate system can be calculated from deviation quantity of past observation pattern 97 and past reference pattern 98 and deviation quantity of currently taken observation pattern 95 and reference pattern 96. Concretely, the deviation quantity of the reference pattern 98 is deviation quantity of observation coordinates before a certain number of times of measurement or coordinates separated by fixed distance or coordinates observed before fixed time, for example. As described above, rotation angle θ of the wafer coordinate system, scale correction value α and deviation quantity ΔX/ΔY can be calculated. Calculation example of observation patterns for 2 points is now described.

First, rotation change of wafer can be expressed as follows:

$$\theta = \tan^{-1}\{(y2'-y1')/(x2'-x1')\} \tan^{-1}\{(y2-y1)/(x2-x1)\}$$

Further, scale change of wafer can be expressed as follows:

$$\alpha = \{(x2'-x1')^2+(y2'-y1')^2\}/\{(x2-x1)^2+(y2-y1)^2\}$$

On the other hand, it is supposed that scale change in XY plane is uniform in regard to deviation quantity of the center of wafer. Accordingly, since coordinates of the wafer center of reference pattern, coordinate relation of 2 reference patterns 96 and 98, coordinates of the wafer center of observation pattern and coordinate relation of 2 observation patterns 95 and 97 have similar relation, the deviation quantity ΔX/ΔY can be calculated in consideration of scale correction value α and rotation angle θ.

The coordinate correction data can be set again on the basis of the above parameters, so that coordinate deviation of next observation pattern and reference pattern can be reduced. The coordinate correction data is updated successively, so that observation with high coordinate accuracy can be realized while avoiding reduction of throughput due to alignment operation from beginning to end of observation of wafer.

Furthermore, as the more stable correction method of coordinates, past several calculation data are averaged instead of one calculation data as described above and various parameters such as deviation quantity of wafer center, rotation angle and scale correction value are updated, so that more reliable coordinate correction data is obtained.

As described above, according to the present invention, deviation of sample coordinates due to temperature change can be reduced while suppressing increase of device cost and reduction of throughput, so that there can be provided the device which can make inspection for a long time with high observation magnification. Moreover, as secondary effect, the device is effective even for the case where wafer is deviated with measurement reference due to vibration caused by movement of stage. The method of controlling temperature of wafer to be fixed as in the prior art and the prior-art method of making prediction by simulation cannot cope with sudden deviation, although the present invention can cope with it by updating correction data.

REFERENCE SIGNS LIST 1 column
2 sample chamber
3 load lock 4 mount
5 vacuum pump
6 frame
10 sample
11 electron gun
12 electron beam
13 electron lens
14 deflector
14A position deflector
14B scanning deflector
15 detector
16 electron lens
17 deflection control part
21 stage
22 bar mirror
23 interferometer
24 electrostatic chuck
25 Z sensor
31 conveyance robot
32 vacuum-side gate valve
33 atmosphere-side gate valve
70 column control part
71 position control part
72 stage control part
73 image control part
74 display
80 stage coordinate axis X
81 stage coordinate axis Y
82 wafer coordinate axis x
83 wafer coordinate axis y
90 observation object
91 observation range
100 wafer
101 alignment pattern

The invention claimed is:

1. A charged particle beam device configured to detect a secondary signal generated by irradiating a sample on a stage with a charged particle beam and to display an image of the sample on a display unit, the charged particle beam device comprising:
a control part which calculates a positional deviation quantity between a coordinate system of the sample and a coordinate system of the stage, based on the secondary signal generated from an alignment pattern on the sample having known coordinate values in the coordinate system of the sample, to produce coordinate correction data,
wherein the control part is configured to:
update the coordinate correction data based on the positional deviation quantity between a first circuit pattern or a first defect as a first observation object and a reference pattern having known coordinate values in the coordinate system of the sample, and the reference pattern is compared with the first observation object, and
obtain an image of a second circuit pattern or a second defect which becomes a second observation object after the first circuit pattern or the first defect by using the updated coordinate correction data, and
wherein the coordinate correction data is updated when the positional deviation quantity exceeds a predetermined threshold, and the predetermined threshold is automatically set in accordance with an observation range or an observation magnification.

2. The charged particle beam device according to claim 1, wherein the control part is further configured to:
calculate, from the positional deviation quantity, a change amount of a rotation angle of the sample, a scale correction value of the sample, and a change amount of a center position of the sample, and
update the coordinate correction data based on the change amount of a rotation angle of the sample, the scale correction value of the sample, and the change amount of a center position of the sample.

3. The charged particle beam device according to claim 1, wherein the reference pattern is produced from design data.

4. The charged particle beam device according to claim 1, wherein the first circuit pattern or the first defect as the first observation object is specified by coordinates values sent from an inspection device different from the charged particle beam device.

* * * * *